May 21, 1968 R. H. BOSWORTH 3,384,865

MOUNTING OF CIRCUIT COMPONENTS

Filed Jan. 4, 1966

INVENTOR
R. H. BOSWORTH
BY

ATTORNEY

United States Patent Office 3,384,865
Patented May 21, 1968

3,384,865
MOUNTING OF CIRCUIT COMPONENTS

Raymond H. Bosworth, Watchung, N.J., assignor to Bell Telephone Laboratories, Incorporated, New York, N.Y., a corporation of New York Filed Jan. 4, 1966, Ser. No. 518,644
1 Claim. (Cl. 339—193)

ABSTRACT OF THE DISCLOSURE

Flexibility in the mounting of circuit components is achieved by employing individual socket clips in conjunction with a multiapertured chassis. Each clip includes a stem and an offset sleeve and is rotatably mounted on the chassis. By rotating a group of clips slightly in selected apertures the offset sleeves can be aligned to receive circuit elements of varying sizes.

This invention relates to the mounting of circuit components and, more particularly, to the mounting of multiterminal components on printed circuit boards.

It is customary to mount multiterminal components, such as transistors, on a chassis by using multiapertured sockets of fixed design. Each socket is an integral unit and as such adds undesirable bulk to the chassis. Moreover, the apertures have a fixed spacing so that different types of sockets are generally required for different kinds of components. This requirement hinders the experimental substitution of components.

In addition, the sockets must be adapted to their chassis. This often requires extensive chassis modifications, particularly in the case of printed circuit boards.

Accordingly, it is an object of the invention to achieve flexibility in the mounting of circuit components. Another object is to eliminate the need for multiapertured sockets in the mounting of circuit components. A related object is to provide a mounting configuration which is adaptable to a wide variety of components. A still further object is to permit mounting modifications without necessitating extensive chassis changes.

In accomplishing the foregoing and related objects the invention provides individual socket clips which are mounted upon a chassis to accommodate the individual terminals or prongs of various circuit components. Each socket clip is desirably fabricated from a single sheet stamping to form a terminal stem that extends into an offset sleeve. The clips are placed in apertures of the circuit board with their offset sleeves on the top side. Because each sleeve is offset with respect to the stem of the clip, it can be swung through an arc with respect to others in its vicinity to provide the desired mounting configuration.

To accommodate a different mounting configuration the clips may be unsoldered and repositioned by being swung through an appropriate arc. Because individual terminals of the circuit components are connected to individual socket clips, the bulk associated with conventional multiapertured sockets is eliminated.

It is a feature of the invention that the socket clips can be manufactured from a single sheet stamping of material which provides spring tension. In one embodiment of the socket clip the stamping takes the form of a T which is folded about its axis of symmetry with the extremities of the crossbar pressed against a cylinder to form a flared sleeve.

Other aspects of the invention will become apparent after considering an illustrative embodiment taken in conjunction with the drawing in which.

Figure 1A:
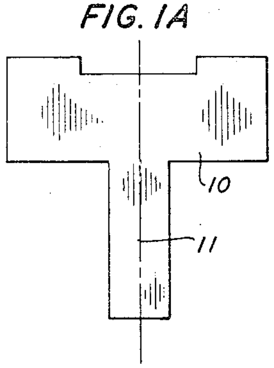
FIG. 1A is a diagram of a stamping for a socket clip fabricated in accordance with the invention.

Turning to FIG. 1A, the fabrication of a socket clip in accordance with the invention begins with a single sheet stamping 10 of ductile material exhibiting spring tension. A suitable material is an alloy of beryllium and copper.

The stamping 10 takes the form of a T with raised portions at the extremities of its crossbar. In fabrication, the stamping 10 is folded about its axis of symmetry 11—with its extremities pressed against a cylindrical form. The result is a socket clip 20 of FIG. 1B having a sleeve 12, formed by the cylinder (not shown), and a stem 13. The sleeve 12 is offset from the stem 13 by a distance *d*, and is flared at the top to facilitate the insertion of circuit component pins and leads. In addition, the sleeve 12 exhibits a lengthwise slit *s*, as shown in FIG. 1C.

Because of the offset distance *d* and the way in which the stamping 11 is folded, the inside, i.e., acceptance diameter of the sleeve 12, is expandable with respect to the axis of symmetry 11, rather than the line of demarcation between the barrel of the sleeve and the flat surface of the offset region. This permits the sleeve to accommodate a wider range of insert diameters than would otherwise be the case.

In a working model of the socket clip, fabricated from a stamping having a thickness of five mils, the acceptance diameter of the sleeve was set at 16 mils, but because of the offset effect the sleeve was able to accept component pins and leads in the range of from 17 to 25 mils. Another socket clip with an acceptance diameter of 25 mils was able to accept leads up to 40 mils in thickness.

Figure 1B:
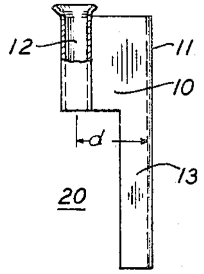
FIG. 1B is a side view of a socket clip formed from the stamping of FIG. 1A.
Figure 1C:
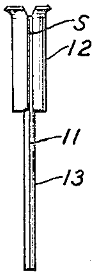
FIG. 1C is an end view of the socket clip of FIG. 1B.
Figure 2:
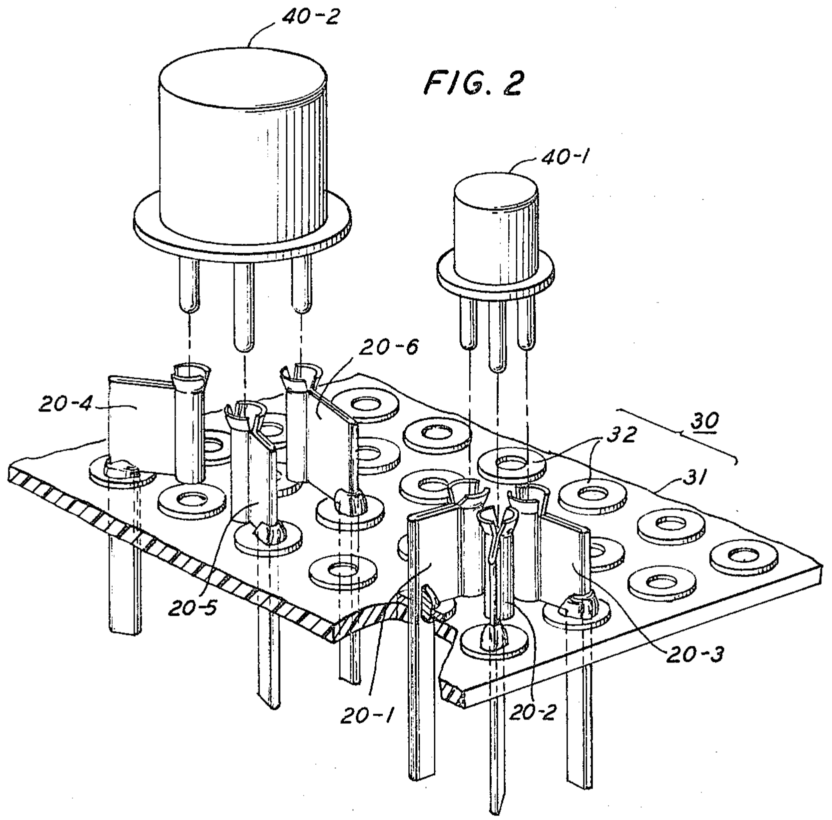
FIG. 2 is a perspective view of a circuit board upon which are disposed various socket clips for accommodating electrical components.

Once fabricated, socket clips of the kind shown in FIG. 1B are disposed upon a chassis, as shown illustratively in FIG. 2. The chassis of FIG. 2 takes the form of a printed circuit board 30 of conventional design. Such a board has a multi-apertured base 31 of phenolic or glass epoxy material upon which is bonded a conductive material, such as copper. On the top side of the board 30 the copper is etched away, leaving circular "land" areas 32 enclosing the various apertures. The under side of the board 30 has a complementary cladding (not shown) of standard design, for which the surface opposite each "land" is devoid of copper to present short-circuiting.

To form a mounting for a circuit component, one clip for each terminal of the component is inserted into an aperture of the board 30 with the sleeve of the clip on the top side and the stem extending through to the under side to form a wiring terminal. The clips are then oriented on the board according to the spacing of the terminals associated with the component for which they serve as a mount. This is done by rotating the clips through an arc to a desired position after which the clip is soldered into place against its associated land area.

As shown in FIG. 2, the clips may be disposed to serve as a mount for a component 40–1 with closely set pins or a circuit component 40–2 with widely spaced pins. In the former case, clips 20–1 through 20–3 are mounted in three adjoining apertures and positionally aligned with respect to the pins of the component 40–1. In the case of the second component 40–2, the wide spacing of the pins has necessitated placing socket clips 20–4 through 20–6 in nonadjoining apertures, thus illustrating the flexibility in mounting that is achieved by use of the invention.

It is to be noted that when components of different base configurations are to be substituted for those previously mounted on the board, the clips can be soldered and repositioned to form a desired configuration having either a larger or a smaller pin spacing than existed previously.

Other modifications and adaptations of the invention will occur to those skilled in the art.

What is claimed is:

1. Apparatus for mounting pronged electric circuit components comprising; a plurality of individual socket clips, each of said socket clips including, a stem, an offset extending outwardly from said stem and integral therewith, and a sleeve extending outwardly from said offset and integral therewith, said sleeve having a lengthwise slit and being expandable with said stem; and a chassis with apertures therein, each of said socket clips being rotatably disposed upon said chassis with said stem extending through one of said apertures whereby a plurality of said socket clips may be rotated to achieve different spacings between said sleeves of said socket clips.

References Cited

UNITED STATES PATENTS

| | | | |
|---|---|---|---|
| 2,149,084 | 2/1939 | Cook | 339—258 XR |
| 2,926,328 | 2/1960 | Flanagan | 339—258 XR |
| 3,176,256 | 3/1965 | Turinsky | 339—31 |

FOREIGN PATENTS

| | | |
|---|---|---|
| 228,862 | 8/1963 | Austria. |
| 1,105,490 | 4/1961 | Germany. |

PATRICK A. CLIFFORD, *Primary Examiner.*